United States Patent
Sampath et al.

(10) Patent No.: US 8,306,096 B2
(45) Date of Patent: Nov. 6, 2012

(54) INTERFERENCE REDUCTION USING VARIABLE DIGITAL-TO-ANALOG CONVERTER (DAC) SAMPLING RATES

(75) Inventors: Hemanth Sampath, San Diego, CA (US); Christian Holenstein, San Diego, CA (US); Jeremy Huei Lin, San Diego, CA (US); Tamer Adei Kadous, San Diego, CA (US); Thomas Domenick Marra, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 12/820,957

(22) Filed: Jun. 22, 2010

(65) Prior Publication Data

US 2010/0328127 A1  Dec. 30, 2010

Related U.S. Application Data

(60) Provisional application No. 61/220,965, filed on Jun. 26, 2009.

(51) Int. Cl.
*H04B 1/38* (2006.01)

(52) U.S. Cl. ........ 375/219; 375/222; 375/275; 375/333; 375/346; 341/144; 341/174; 341/176; 341/180; 341/181

(58) Field of Classification Search ............... 341/144, 341/174, 176, 180, 181; 375/219, 222, 275, 375/333, 346
See application file for complete search history.

(56) References Cited

U.S. PATENT DOCUMENTS

| | | | |
|---|---|---|---|
| 3,999,129 A | | 12/1976 | Kasson |
| 6,028,891 A * | | 2/2000 | Ribner et al. ................. 375/222 |
| 6,329,937 B1 * | | 12/2001 | Harman ........................ 341/118 |
| 6,563,448 B1 * | | 5/2003 | Fontaine ....................... 341/143 |
| 6,563,862 B1 * | | 5/2003 | Knutson et al. ............... 375/219 |
| 6,876,319 B2 * | | 4/2005 | Webster et al. ............... 341/143 |
| 7,155,654 B2 * | | 12/2006 | Chien et al. ................... 714/747 |
| 7,573,944 B2 * | | 8/2009 | Chang et al. .................. 375/260 |
| 7,660,374 B2 * | | 2/2010 | Casabona et al. ............. 375/346 |
| 7,965,761 B2 * | | 6/2011 | Shattil .......................... 375/147 |
| 7,965,982 B2 * | | 6/2011 | Palin et al. .................... 455/41.2 |
| 2004/0037366 A1 * | | 2/2004 | Crawford ...................... 375/295 |
| 2005/0276350 A1 * | | 12/2005 | Li ................................ 375/302 |
| 2009/0227214 A1 * | | 9/2009 | Georgantas et al. ........... 455/86 |
| 2010/0098191 A1 * | | 4/2010 | Morris et al. ................. 375/322 |
| 2011/0026509 A1 * | | 2/2011 | Tanaka ......................... 370/338 |

FOREIGN PATENT DOCUMENTS

| | | |
|---|---|---|
| EP | 1372286 | 12/2003 |
| EP | 1737258 | 12/2006 |
| GB | 2422064 | 7/2006 |
| WO | WO 2008022241 | 2/2008 |

OTHER PUBLICATIONS

International Search Report and Written Opinion—PCT/US2010/039795, International Search Authority—European Patent Office—Sep. 29, 2010.

* cited by examiner

*Primary Examiner* — Linh Nguyen

(74) *Attorney, Agent, or Firm* — Larry J. Moskowitz; Jeffrey D. Jacobs

(57) ABSTRACT

A method for interference reduction is described. A sampling frequency is selected for a digital-to-analog converter (DAC) so that images within a DAC output signal do not interfere with one or more receivers. A sample rate is adjusted of an input signal that is provided to the DAC to match the sampling frequency for the DAC.

33 Claims, 11 Drawing Sheets

INTERFERENCE REDUCTION USING VARIABLE DIGITAL-TO-ANALOG CONVERTER (DAC) SAMPLING RATES

RELATED APPLICATIONS

This application is related to and claims priority from U.S. Provisional Patent Application Ser. No. 61/220,965 filed Jun. 26, 2009, for "MULTIPLE BAND AND CONCURRENT TECHNOLOGY SUPPORT USING VARIABLE DIGITAL-TO-ANALOG CONVERTER (DAC) SAMPLING RATES."

TECHNICAL FIELD

The present disclosure relates generally to wireless communication systems. More specifically, the present disclosure relates to systems and methods for interference reduction using variable digital-to-analog converter (DAC) sampling rates.

BACKGROUND

Wireless devices have become smaller and more powerful in order to meet consumer needs and to improve portability and convenience. Consumers have become dependent upon wireless devices such as cellular telephones, personal digital assistants (PDAs), laptop computers and the like. Consumers have come to expect reliable service, expanded areas of coverage and increased functionality.

A wireless device may be capable of communicating using multiple wireless communication standards. A wireless device may be capable of communicating using a wireless local area network (WLAN), Bluetooth, cellular and Global Positioning System (GPS). In some instances, a wireless device may communicate using multiple wireless standards concurrently. For example, a Bluetooth stereo headset may receive music from a computer while the computer downloads songs from an Internet website using a wireless local area network (WLAN).

Transmissions sent by the wireless device may interfere with communications received by the wireless device or communications received by other wireless devices. For example, a digital-to-analog converter (DAC) may introduce DAC images into transmissions, which fall on or near the frequencies used by receivers for receiving. These DAC images may cause interference. Large and high powered filters can remove some of the DAC images, but at a high cost.

SUMMARY

A method for interference reduction is described. The method is implemented in a wireless device. A sampling frequency for a digital-to-analog converter (DAC) is selected so that images within a DAC output signal do not interfere with one or more receivers. A sample rate of an input signal that is provided to the DAC to match the sampling frequency for the DAC is adjusted.

A frequency or frequencies used by the one or more receivers may be determined. The sampling frequency for the DAC may be selected to avoid interference with the frequency or frequencies used by the one or more receivers. The sample rate of the input signal may be selected to avoid interference with the frequency or frequencies used by the one or more receivers. The input signal may be converted from a digital signal to an analog signal using the DAC with the selected sampling frequency.

The input signal may be split into an inphase digital signal and a quadrature digital signal. The inphase digital signal may be converted to an inphase analog signal using an inphase DAC (I-DAC) with the sampling frequency. The quadrature digital signal may be converted to a quadrature analog signal using a quadrature DAC (Q-DAC) with the sampling frequency.

The wireless device may be a multi-mode wireless communication device. The one or more receivers may include a cellular receiver, a Global Positioning System (GPS) receiver, a Bluetooth receiver or a Wireless Local Area Network (WLAN) receiver of the wireless device. The one or more receivers may also include a receiver on another wireless device.

One or more DAC images causing a failure of compliance testing for spurious emissions by the wireless device may be determined. The sampling frequency may be selected so that DAC images are not located in a restricted frequency band. The sample rate of the input signal may be adjusted using one or more interpolators. Outputs of the one or more interpolators may be input into a multiplexer. The one or more interpolators may be aligned serially. A final interpolator output may be input into a re-sampler. The sampling frequency for the DAC may be selected based on a band class in which a cellular transmitter of the wireless device is currently operating.

A multi-mode modem for a wireless device is also described. The multi-mode modem includes a controller that is configured to determine a sampling frequency for a digital-to-analog converter (DAC) so that images within the output signal of the DAC do not interfere with one or more receivers. The multi-mode modem also includes an interpolator bank that is configured to increase a sample rate of an input signal that is to be provided as an input to the DAC to match the determined sampling frequency for the DAC.

The multi-mode modem may also include a multiplexer that receives the output of each interpolator in the interpolator bank. The controller may be configured to select the output of an interpolator that is provided to the DAC. The multi-mode modem may further include a re-sampler that receives an input signal with a lower limit sample rate and provides an output signal with a sample rate between the lower limit sample rate and an upper limit sample rate. The controller may be configured to select the sample rate of the output signal.

The sampling frequency for the DAC may be selected to avoid interference with a frequency or frequencies used by the one or more receivers. The input signal may be split into an inphase digital signal and a quadrature digital signal. The multi-mode modem may include an inphase DAC (I-DAC) and a quadrature DAC (Q-DAC). The I-DAC may convert the inphase digital signal to an analog signal and the Q-DAC may convert the quadrature digital signal to an analog signal.

The one or more receivers may include a cellular receiver, a Global Positioning System (GPS) receiver, a Bluetooth receiver or a Wireless Local Area Network (WLAN) receiver of the wireless device. The one or more receivers may also include a receiver on another wireless device. The sampling frequency for the DAC may be determined so that DAC images are not located in a restricted frequency band. The multi-mode modem may also include a multiplexer. Outputs of the interpolator bank may be input into the multiplexer. The multi-mode modem may further include a re-sampler. The interpolator bank may include one or more interpolators aligned serially. A final interpolator output may be input into the re-sampler. The sampling frequency for the DAC may be selected based on a band class in which a cellular transmitter of the wireless device is currently operating.

An apparatus for interference reduction is described. The apparatus includes means for selecting a sampling frequency for a digital-to-analog converter (DAC) so that images within a DAC output signal do not interfere with one or more receivers. The apparatus also includes means for adjusting a sample rate of an input signal that is provided to the DAC to match the sample frequency for the DAC.

A computer-program product comprising a computer-readable medium having instructions thereon is also described. The instructions include code for selecting a sampling frequency for a digital-to-analog converter (DAC) so that images within a DAC output signal do not interfere with one or more receivers. The instructions may also include code for adjusting a sample rate of an input signal that is provided to the DAC to match the sample frequency for the DAC.

DETAILED DESCRIPTION

Figure 1:
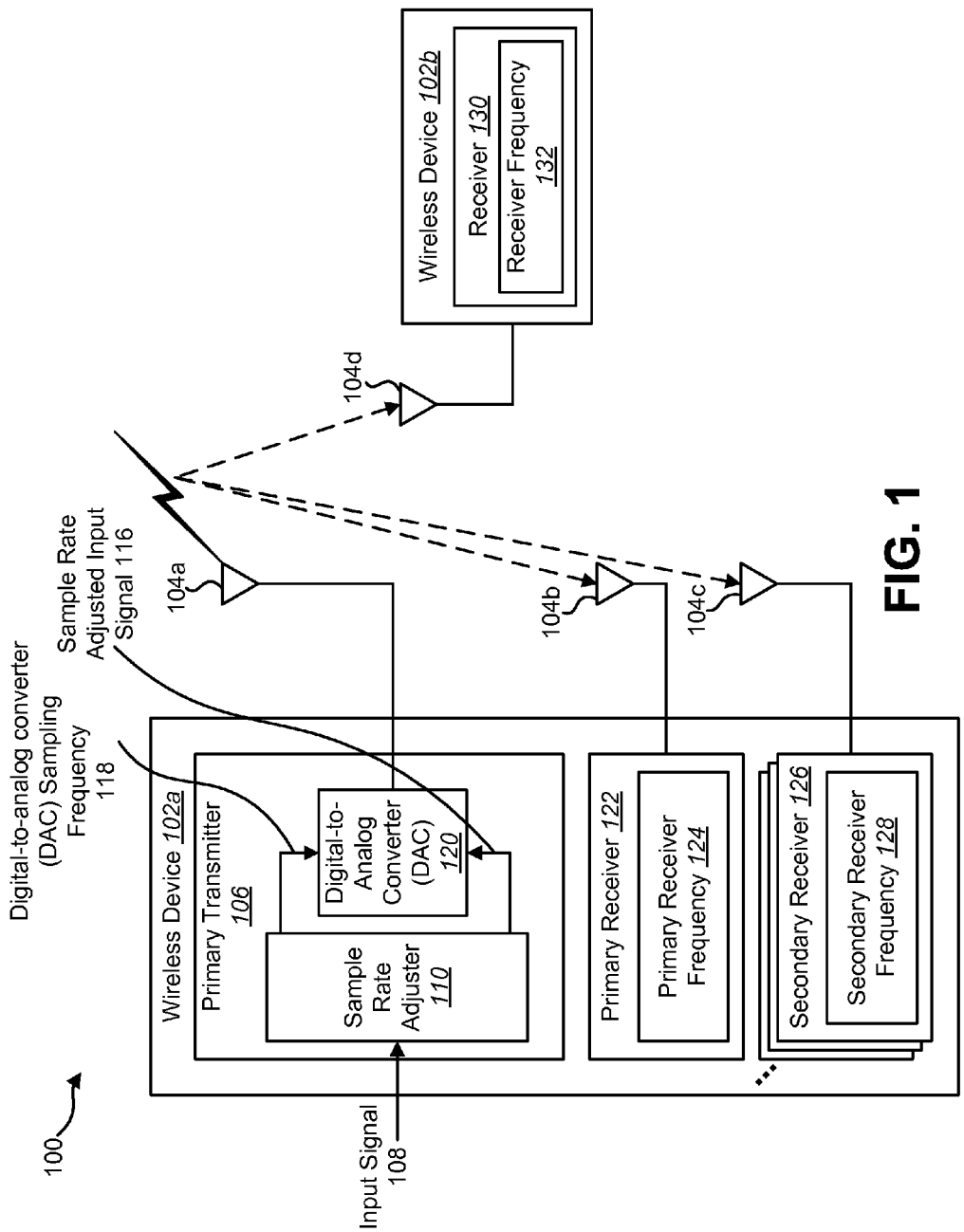
FIG. 1 shows a wireless communication system with multiple wireless devices.

FIG. 1 shows a wireless communication system 100 with multiple wireless devices 102. A wireless device 102 may be a base station, a wireless communication device, a controller, or the like. A base station is a station that communicates with one or more wireless communication devices. A base station may also be referred to as, and may include some or all of the functionality of, an access point, a broadcast transmitter, a Node B, an evolved Node B, etc. The term "Base Station" will be used herein. Each base station provides communication coverage for a particular geographic area. A base station may provide communication coverage for one or more wireless communication devices. The term "cell" can refer to a base station and/or its coverage area, depending on the context in which the term is used.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, etc. A wireless communication device may communicate with zero, one or multiple base stations on the downlink and/or uplink at any given moment. The downlink (or forward link) refers to the communication link from a base station to a wireless communication device, and the uplink (or reverse link) refers to the communication link from a wireless communication device to a base station.

Wireless communication systems 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems and spatial division multiple access (SDMA) systems.

A "multi-mode" wireless device 102 may use multiple wireless technologies simultaneously. Examples of such technologies include Bluetooth, cellular, wireless local area network (WLAN) and the Global Positioning System (GPS). In one configuration, the wireless device 102 may send cellular communications using a first antenna 104a, receive cellular communications using a second antenna 104b and receive other communications (e.g., Bluetooth, WLAN, GPS) using a third antenna 104c.

The wireless technologies may operate in different band classes. A band class is an allocation of a portion of the frequency spectrum for wireless communications. Examples of band classes include Cellular, Personal Communications Service (PCS) and International Mobile Telecommunications (IMT). Different frequencies may be utilized for different band classes. Different duplex offset may also be utilized for different band classes. The term "duplex offset" may refer to the difference in frequency between a wireless communications transmitter and a receiver. For example, the mobile transmit frequency is 824-849 MHz for the Cellular band class, 1850-1910 MHz for the PCS band class, 1920-1980 MHz for the IMT band class, etc. The duplex offset is 45 MHz (i.e., the receiver operates 45 MHz above the transmitter) for the cellular band class, 80 MHz for the PCS band class, 190 MHz for the IMT band class, etc.

A first wireless device 102a may use a primary transmitter 106 to transmit communications. In one configuration, the primary transmitter 106 may be a cellular transmitter. Transmitters are discussed in further detail below in relation to FIG. 3. The primary transmitter 106 may prepare an input signal 108 for transmission via the first antenna 104a. For example, the primary transmitter 106 may convert the input signal 108 from a digital signal to an analog signal using a digital-to-analog converter (DAC) 120 prior to transmission.

The digital-to-analog converter (DAC) 120 may operate using a clock signal with a digital-to-analog converter (DAC) sampling frequency 118. The digital-to-analog converter (DAC) 120 may produce an output signal having undesirable frequency "images." These images may result from the digital-to-analog converter (DAC) 120 output holding a particular value for one period of the clock cycle, so that the digital-to-analog converter (DAC) 120 output exactly matches the desired signal only once during each clock cycle. This is sometimes referred to as a zero-order hold. During the rest of the clock cycle, the digital-to-analog converter (DAC) 120 output and ideal signal may differ, creating error energy. Digital-to-analog converter (DAC) 120 images may be produced at harmonics of the digital-to-analog converter (DAC) sampling frequency 118. For example, if the digital-to-analog converter (DAC) sampling frequency 118 is 100 megahertz (MHz), an undesirable image may be produced at 100 MHz, 200 MHz, 300 MHz, and so on.

The images produced by the digital-to-analog converter (DAC) 120 output signal may have implications for wireless devices 102, particularly "multi-mode" devices that are configured to support multiple wireless technologies. For example, the wireless device 102a may include a primary receiver 122. The primary receiver 122 may receive communications using the second antenna 104b. The received communications may be received at a primary receiver frequency 124. If the images produced in the digital-to-analog converter (DAC) 120 output signal fall on or near the primary receiver frequency 124, interference with the primary receiver 122 may occur. Likewise, if the images produced in the digital-to-analog converter (DAC) 120 output signal fall on or near a secondary receiver frequency 128 used by a secondary receiver 126 on the wireless device 102a, interference with the secondary receiver 126 may occur. A secondary receiver 126 on the wireless device 102a may receive wireless communications via a third antenna 104c. The secondary receiver 126 may receive Bluetooth signals, wireless local area network (WLAN) signals, Global Positioning System (GPS) signals, etc. A wireless device 102 may have multiple secondary receivers 126, with each secondary receiver 126 having an antenna 104c.

The primary receiver frequency 124 may depend on the band class in which the primary transmitter 106 is currently operating. Thus, the digital-to-analog converter (DAC) sampling frequency 118 of the digital-to-analog converter (DAC) 120 may be adjusted based on the band class in which the primary transmitter 106 is currently operating. The primary receiver frequency 124 may also depend on which wireless technology is presently being used.

A second wireless device 102b may receive the transmitted signals from the first wireless device 102a using an antenna 104d. Interference may occur when the images produced in the digital-to-analog converter (DAC) 120 output signal fall on or near a receiver frequency 132 used by a receiver 130 on the second wireless device 102b.

Because a multi-mode wireless device 102 should be capable of operating in different band classes, it may be desirable that the digital-to-analog converter (DAC) sampling frequency 118 be selected so that DAC images do not cause interference with the primary receiver 122, secondary receivers 126 or the receiver 130 on the second wireless device 102b. Specifically, the digital-to-analog converter (DAC) sampling frequency 118 may be chosen so that the multi-mode modem is able to work with all the possible band classes and duplex offsets that the multi-mode modem is supposed to be able to support. However, it may be extremely difficult to select a single digital-to-analog converter (DAC) sampling frequency 118 that will accomplish this objective. Instead, it may be beneficial for the digital-to-analog converter (DAC) sampling frequency 118 to be adjustable to avoid interference. The digital-to-analog converter (DAC) sampling frequency 118 may be adjusted so that images in the digital-to-analog converter (DAC) 120 output signal are outside of any frequency bands within which receivers of interest may be operating.

In order to adjust the digital-to-analog converter (DAC) sampling frequency 118, the sample rate of the signal input to the digital-to-analog converter (DAC) 120 should also be changed. The primary receiver 106 may include a sample rate adjuster 110. The sample rate adjuster 110 is discussed in additional detail below in relation to FIG. 3. The sample rate adjuster 110 may receive an input signal 108. The sample rate adjuster 110 may then adjust the sample rate for the input signal 108 and output a sample rate adjusted input signal 116 to a digital-to-analog converter (DAC) 120. The sample rate adjuster 110 may also determine a digital-to-analog converter (DAC) sampling frequency 118. The digital-to-analog converter (DAC) sampling frequency 118 may be output to the digital-to-analog converter (DAC) 120 by the sample rate adjuster 110. By adjusting both the sample rate of the input signal 108 and the digital-to-analog converter (DAC) sampling frequency 118, images in the digital-to-analog converter (DAC) 120 output may be moved in frequency to avoid interference.

Figure 2:
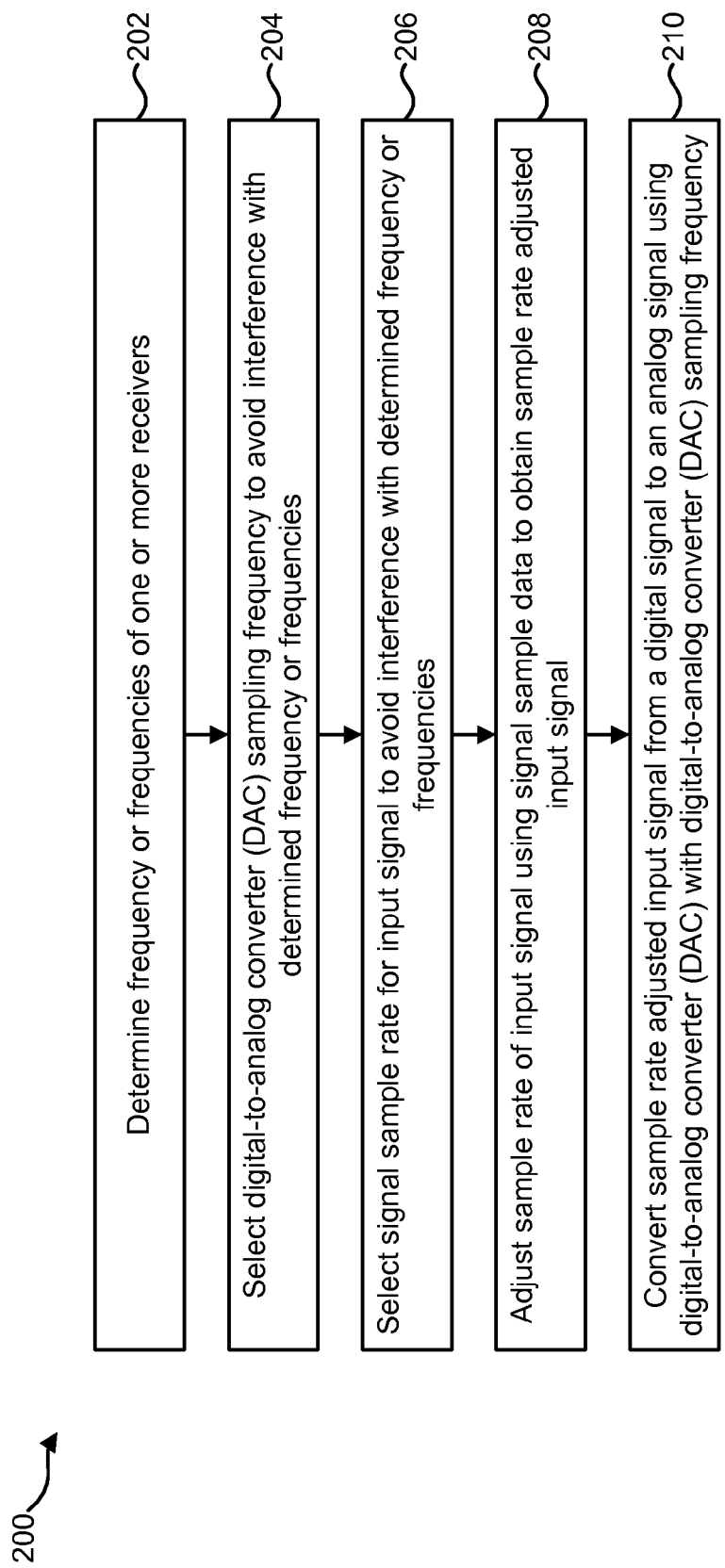
FIG. 2 is a flow diagram of a method for adjusting sample rates in a digital-to-analog converter (DAC) to reduce interference.

FIG. 2 is a flow diagram of a method 200 for adjusting sample rates in a digital-to-analog converter (DAC) 120 to reduce interference. The method 200 may be performed by a wireless device 102a. The wireless device 102a may determine 202 a frequency or frequencies of one or more receivers. The one or more receivers may be receivers that can potentially receive interference from the wireless device 102a. The receivers may include a primary receiver 122 (such as a cellular receiver) on the wireless device 102a, a secondary receiver 126 (such as a Bluetooth receiver, a WLAN receiver or a GPS receiver) on the wireless device 102a and one or more receivers 130 on one or more other wireless devices 102b.

The wireless device 102a may select 204 a digital-to-analog converter (DAC) sampling frequency 118 to avoid interference with the determined frequency or frequencies. In one configuration, the digital-to-analog converter (DAC) sampling frequency 118 may depend on which wireless technology or technologies are being used by the wireless device 102a. The digital-to-analog converter (DAC) sampling frequency 118 may also depend on the wireless technologies being used by other nearby wireless devices 102b.

The wireless device 102a may also select 206 a signal sample rate for the input signal 108 to avoid interference with the determined frequency or frequencies. In order to adjust the sample rate of a digital-to-analog converter (DAC) 120, both the digital-to-analog converter (DAC) sampling frequency 118 and the sample rate of the signal input into the digital-to-analog converter (DAC) 120 need to be changed. The wireless device 102a may then adjust 208 the sample rate of the input signal 108 using the selected signal sample rate to obtain a sample rate adjusted input signal 116. The wireless device 102b may convert 210 the sample rate adjusted input signal 116 from a digital signal to an analog signal using a digital-to-analog converter (DAC) 120 with a digital-to-analog converter (DAC) sampling frequency 118.

Figure 3:
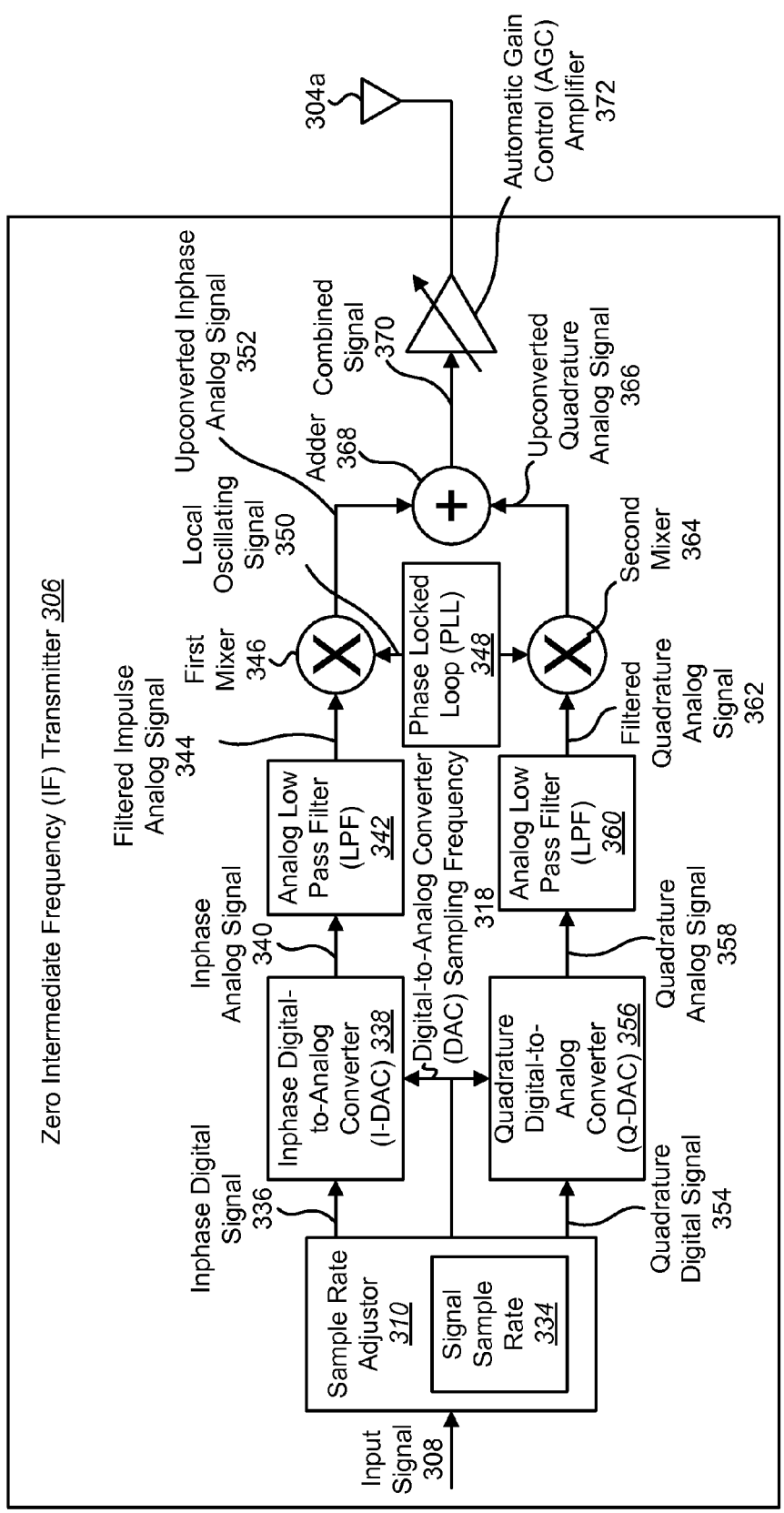
FIG. 3 is a block diagram illustrating a zero intermediate frequency (IF) transmitter for use in the present systems and methods.

FIG. 3 is a block diagram illustrating a zero intermediate frequency (IF) transmitter 306 for use in the present systems and methods. The zero intermediate frequency (IF) transmitter 306 of FIG. 3 may be one configuration of the primary transmitter 106 of FIG. 1. Although a zero intermediate frequency (IF) transmitter 306 is used for purposes of illustration, the techniques herein are not limited to zero intermediate frequency (IF) transmitters 306. For example, a super heterodyne transmitter or a low intermediate frequency transmitter may also be used. In a zero intermediate frequency (IF) transmitter 306, a signal may be directly upconverted from a baseband signal to a radio frequency (RF) signal without any intermediate frequency stages.

The zero intermediate frequency (IF) transmitter 306 may include a sample rate adjuster 310. The sample rate adjuster 310 of FIG. 3 may be one configuration of the sample rate adjuster 110 of FIG. 1. Sample rate adjusters 310 are discussed in further detail below in relation to FIG. 4 and FIG. 5. The sample rate adjuster 310 may receive an input signal 308. The input signal 308 may be a baseband signal. The sample rate adjuster 310 may include a signal sample rate 334. The signal sample rate 334 may correspond to a determined digital-to-analog converter (DAC) sampling frequency 318. In one configuration, the signal sample rate 334 and the digital-to-analog converter (DAC) sampling frequency 318 may be the same.

The sample rate adjuster 310 may output an inphase digital signal 336 and a quadrature digital signal 354. The zero intermediate frequency (IF) transmitter 306 may include an inphase digital-to-analog converter (I-DAC) 338 and a quadrature digital-to-analog converter (Q-DAC) 356. The inphase digital-to-analog converter (I-DAC) 338 may receive the inphase digital signal 336 and the digital-to-analog converter (DAC) sampling frequency 318 from the sample rate adjuster 310. The inphase digital-to-analog converter (I-DAC) 338 may then convert the inphase digital signal 336 to an inphase analog signal 340 using the digital-to-analog converter (DAC) sampling frequency 318. The inphase analog signal 340 may be filtered using an analog low pass filter (LPF) 342. The quadrature digital-to-analog converter (Q-DAC) 356 may receive the quadrature digital signal 354 and the digital-to-analog converter (DAC) sampling frequency 318 from the sample rate adjuster 310. The quadrature digital-to-analog converter (Q-DAC) 356 may then convert the quadrature digital signal 354 to a quadrature analog signal 358 using the digital-to-analog converter (DAC) sampling frequency 318. The quadrature analog signal 358 may be filtered using an analog low pass filter (LPF) 360.

Without adjusting the digital-to-analog converter (DAC) sampling frequency 318 of the quadrature digital-to-analog converter (Q-DAC) 356 and the inphase digital-to-analog converter (I-DAC) 338, both the filtered quadrature analog signal 362 and the filtered inphase analog signal 344 may include undesirable frequency images introduced by the quadrature digital-to-analog converter (Q-DAC) 356 and the inphase digital-to-analog converter (I-DAC) 338 referred to as digital-to-analog converter (DAC) images. The low pass filters (LPFs) 342, 360 typically do not attenuate the DAC images sufficiently to prevent the DAC images from interfering with receivers on the wireless device 102a and receivers on other wireless devices 102b. Instead of trying to filter out the DAC images, the DAC images may be moved in the frequency band so that they no long interfere with receivers on the wireless device 102a or receivers on other wireless devices 102b. Thus, the need for strong analog and/or RF filters to mitigate the interference caused by DAC images may be eliminated.

The filtered inphase analog signal 344 may be upconverted to a radio frequency (RF) using a first mixer 346 and a local oscillating signal 350 generated by a phase locked loop (PLL) 348. The filtered quadrature analog signal 362 may be upconverted to a radio frequency (RF) using a second mixer 364 and the local oscillating signal 350 generated by the phase locked loop (PLL) 348. Without adjusting the digital-to-analog converter (DAC) sampling frequency 318 of the quadrature digital-to-analog converter (Q-DAC) 356 and the inphase digital-to-analog converter (I-DAC) 338, both the upconverted quadrature analog signal 352 and the upconverted quadrature analog signal 366 may include undesirable frequency images that have also been upconverted to radio frequency (RF). These upconverted DAC images may interfere with the primary receiver 122, secondary receivers 126 and receivers 130 located outside of the wireless device 102a, making it more difficult for these receivers to demodulate and receive their respective signals.

By adjusting the digital-to-analog converter (DAC) sampling frequency 318, the upconverted inphase analog signal 352 and the upconverted quadrature analog signal 366 may have adjusted DAC images, decreasing the likelihood of interference. The upconverted inphase analog signal 352 and the upconverted quadrature analog signal 366 may then be added using an adder 368 to obtain a combined signal 370. The combined signal 370 may be amplified using an Automatic Gain Control (AGC) amplifier 372 and then transmitted using an antenna 304a.

Figure 4:
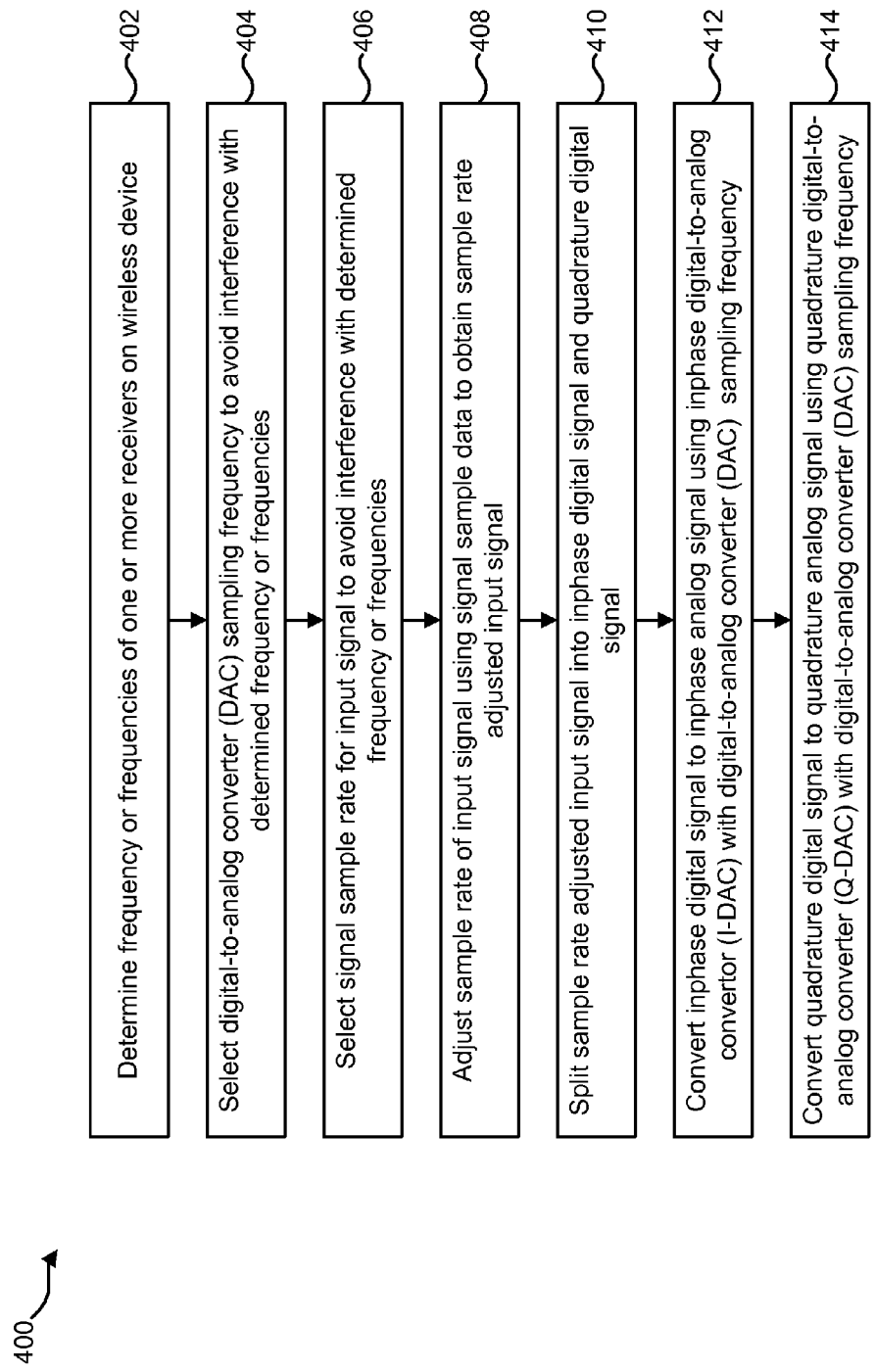
FIG. 4 is a flow diagram of a method for adjusting the digital-to-analog converter (DAC) sampling frequency to reduce interference.

FIG. 4 is a flow diagram of a method 400 for adjusting the digital-to-analog converter (DAC) sampling frequency 318 to reduce interference. The method 400 may be performed by a wireless device 102a. The method 400 may be implemented in software, firmware or hardware of the wireless device 102a (e.g., in a multi-mode modem that is included within a wireless device 102a).

The wireless device 102a may determine 402 the frequency or frequencies of one or more receivers on the wireless device 102a. The frequency of a receiver may refer to the frequency at which the receiver receives desired signals. The wireless device 102a may select 404 a digital-to-analog converter (DAC) sampling frequency 318 to avoid interference with the determined frequency or frequencies. For example, the wireless device 102a may select a digital-to-analog converter (DAC) sampling frequency 318 such that DAC images, when upconverted to radio frequency (RF), do not interfere with the determined frequency or frequencies. In one configuration, the digital-to-analog converter (DAC) sampling frequency 318 may be selected so that frequencies of upconverted DAC images differ from the determined frequency or frequencies by at least 2 MHz.

The wireless device 102a may select 406 a signal sample rate 334 for an input signal 308 to avoid interference with the determined frequency or frequencies. The signal sample rate 334 and the digital-to-analog converter (DAC) clock rate (i.e., the digital-to-analog converter (DAC) sampling frequency 118) are the same. The wireless device 102a may adjust 408 the sample rate 334 of the input signal 308 to the selected signal sample rate 344 to obtain a sample rate adjusted input signal 116. The sample rate adjusted input signal 116 may thus be the input signal 308 with an adjusted sample rate.

The wireless device 102a may split 410 the sample rate adjusted input signal 116 into an inphase digital signal 336 and a quadrature digital signal 354. The wireless device 102a may then convert 412 the inphase digital signal 336 to an inphase analog signal 340 using an inphase digital-to-analog converter (I-DAC) 338 with the digital-to-analog converter (DAC) sampling frequency 318. The wireless device 102a may also convert 414 the quadrature digital signal 354 to a quadrature analog signal 358 using a quadrature digital-to-analog converter (Q-DAC) 356.

Figure 5:
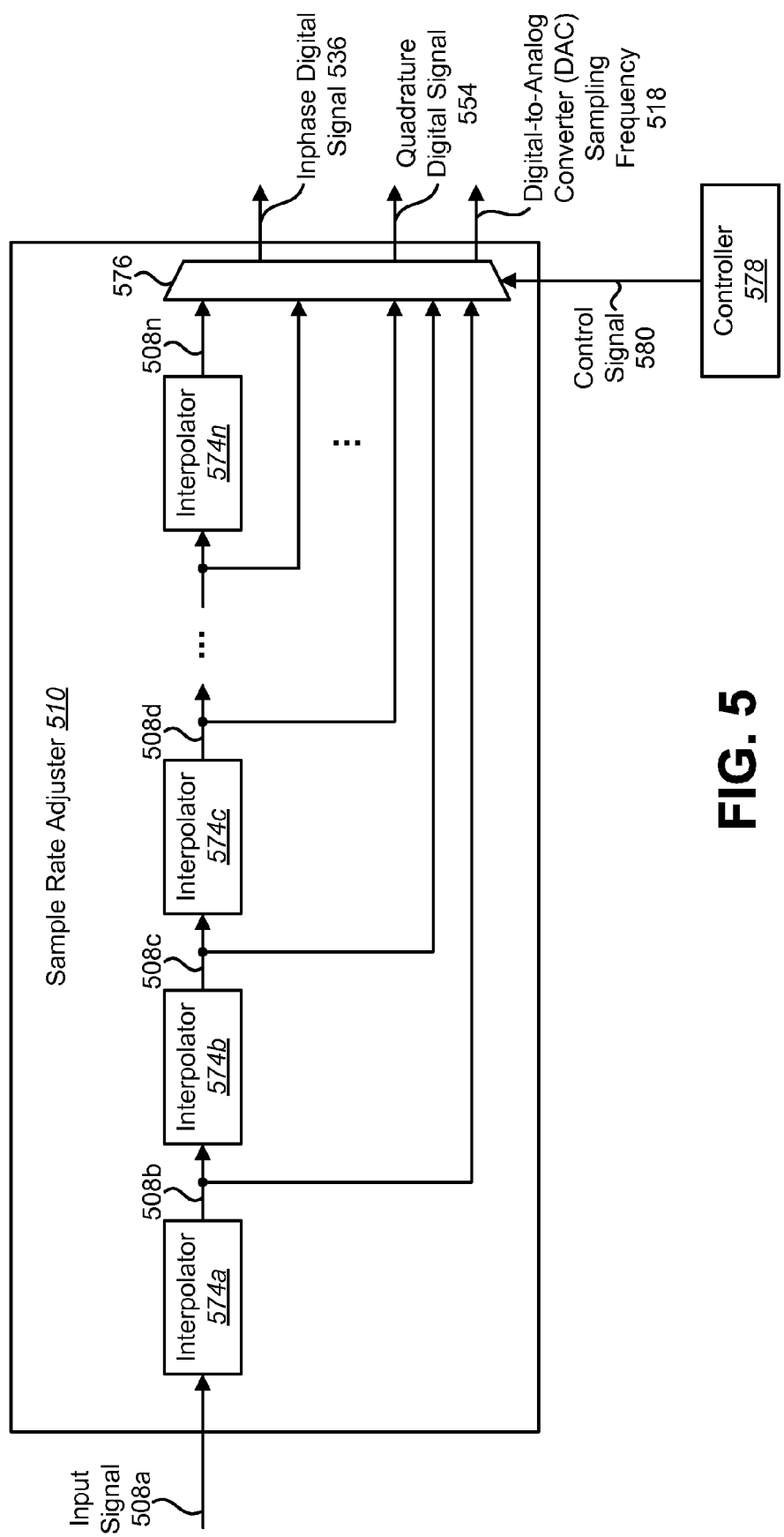
FIG. 5 is a block diagram illustrating a sample rate adjuster for use in the present systems and methods.

FIG. 5 is a block diagram illustrating a sample rate adjuster 510 for use in the present systems and methods. The sample rate adjuster 510 of FIG. 5 may be one configuration of the sample rate adjuster 110 of FIG. 1. The sample rate adjuster 510 may receive an input signal 508a. The input signal 508a may be provided to one or more interpolators 574a-n. Each successive interpolator 574 may double the sample rate for the input signal 508a. For example, in a CDMA system, the chip rate (cx) of the input signal 508a may be cx1, the chip rate of the output 508b of the first interpolator 574a may be cx2 (twice the chip rate of the input signal) and the chip rate of the output 508*c* of the second interpolator 574*b* may be cx4. A group of interpolators 574 may be referred to as an interpolator bank.

A CDMA2000 system may have a fundamental chip rate of 1.2288 MHz. The fundamental chip rate may be referred to as chipx1. Using interpolators 574, the chip rate may be increased to chipx2 (i.e., 1.2288 MHz×2), chipx4 (i.e., 1.2288 MHz×4), chipx8, chipx16, chipx32, chipx64, etc.

In one configuration, the output 508*b*-*n* of an interpolator 574 may be any integer multiple of the sample rate of the input signal 508*a*. An interpolator 574 may be configured to insert a certain number of zeroes between adjacent samples. An interpolator 574 may also include an anti-aliasing filter.

The output of each interpolator 574 may be provided as an input to a multiplexer 576. A control signal 580 may be provided as an input to the multiplexer 576, allowing selection of which output is passed as the inphase digital signal 536 and the quadrature digital signal 554. The inphase digital signal 536 and the quadrature digital signal 554 together represent the complex modulation of the transmit signal. Since the transmit signal has both amplitude and phase modulation, it is by definition complex and requires both an inphase component and a quadrature component.

The control signal 580 may be generated by a controller 578 that determines what the sample rates of the inphase digital signal 536 and the quadrature digital signal 554 should be to avoid interference. The controller 578 may also select the digital-to-analog converter (DAC) sampling frequency 518 of the inphase digital-to-analog converter (I-DAC) 338 and the quadrature digital-to-analog converter (Q-DAC) 356 to avoid interference. Typically, the digital-to-analog converter (DAC) sampling frequency 518 comes from a phase locked loop (PLL) and digital dividers.

Figure 6:
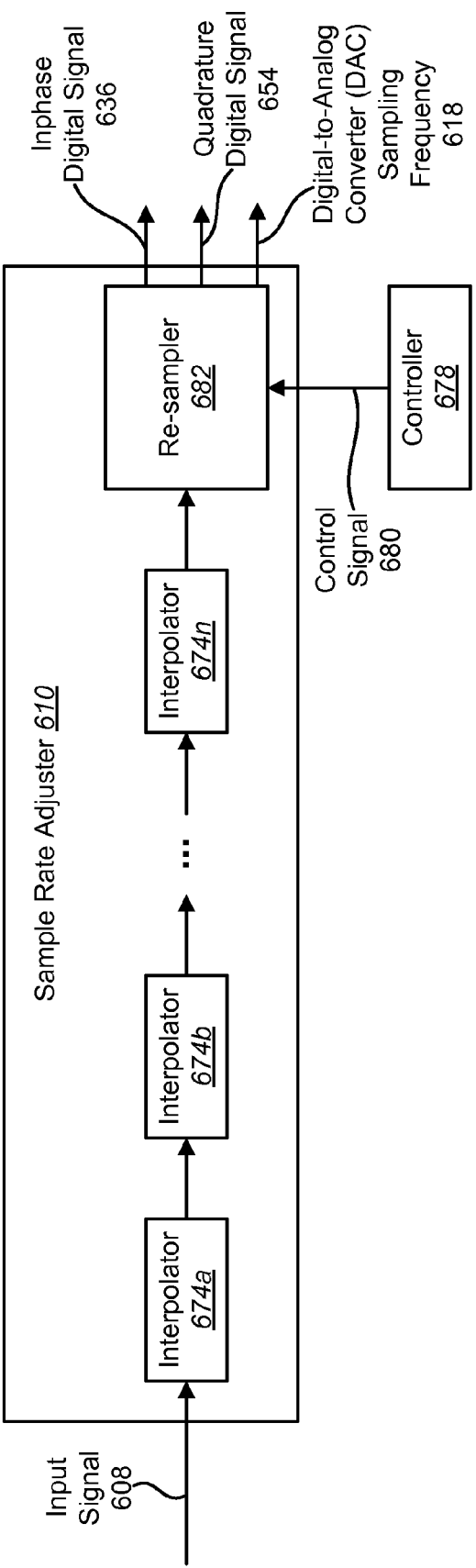
FIG. 6 is a block diagram illustrating another sample rate adjuster for use in the present systems and methods.

FIG. 6 is a block diagram illustrating another sample rate adjuster 610 for use in the present systems and methods. The sample rate adjuster 610 of FIG. 6 may be one configuration of the sample rate adjuster 110 of FIG. 1. The sample rate adjuster 610 may receive an input signal 608. The input signal 608 may then be provided to a first interpolator 674*a*. The output of the first interpolator 674*a* may be input into a second interpolator 674*b*. The input signal 608 may be provided to additional interpolators 674. The output of a final interpolator 674*n* may then be provided to a re-sampler 682. The re-sampler 682 may be a special kind of interpolator. Unlike an interpolator 674, the sample rate of the output of the re-sampler 682 does not have to be an integer multiple of the sample rate of the input signal 608.

For example, the re-sampler 682 may be configured to accept an input at a particular lower limit sample rate (e.g., cx64) and provide an output at any rate between the lower limit sample rate and a particular upper limit sample rate (e.g., cx128). Thus, the use of a re-sampler 682 makes it possible for the DAC images to be placed in any desired frequency location within a given range (which depends on the lower limit sample rate and the upper limit sample rate). A controller 678 may instruct the re-sampler 682 concerning the specific sample rate that the input signal 608 should be sampled at using a control signal 680. Multiple interpolators 674*a*-*n* may be used to change the sample rate of the input signal 608 to the desired lower limit sampling rate prior to passing the input signal 608 through the re-sampler 682.

The re-sampler 682 may output an inphase digital signal 636 and a quadrature digital signal 654. Both the inphase digital signal 636 and the quadrature digital signal 654 may have the desired sampling rate. The re-sampler 682 may also output a digital-to-analog converter (DAC) sampling frequency 618. The digital-to-analog converter (DAC) sampling frequency 618 may be the same as the sample rate of the inphase digital signal 636 and the quadrature digital signal 654.

In one configuration, the sample rate adjuster 110 of FIG. 1 may include a combination of the sample rate adjuster 510 of FIG. 5 and the sample rate adjuster 610 of FIG. 6.

Figure 7:
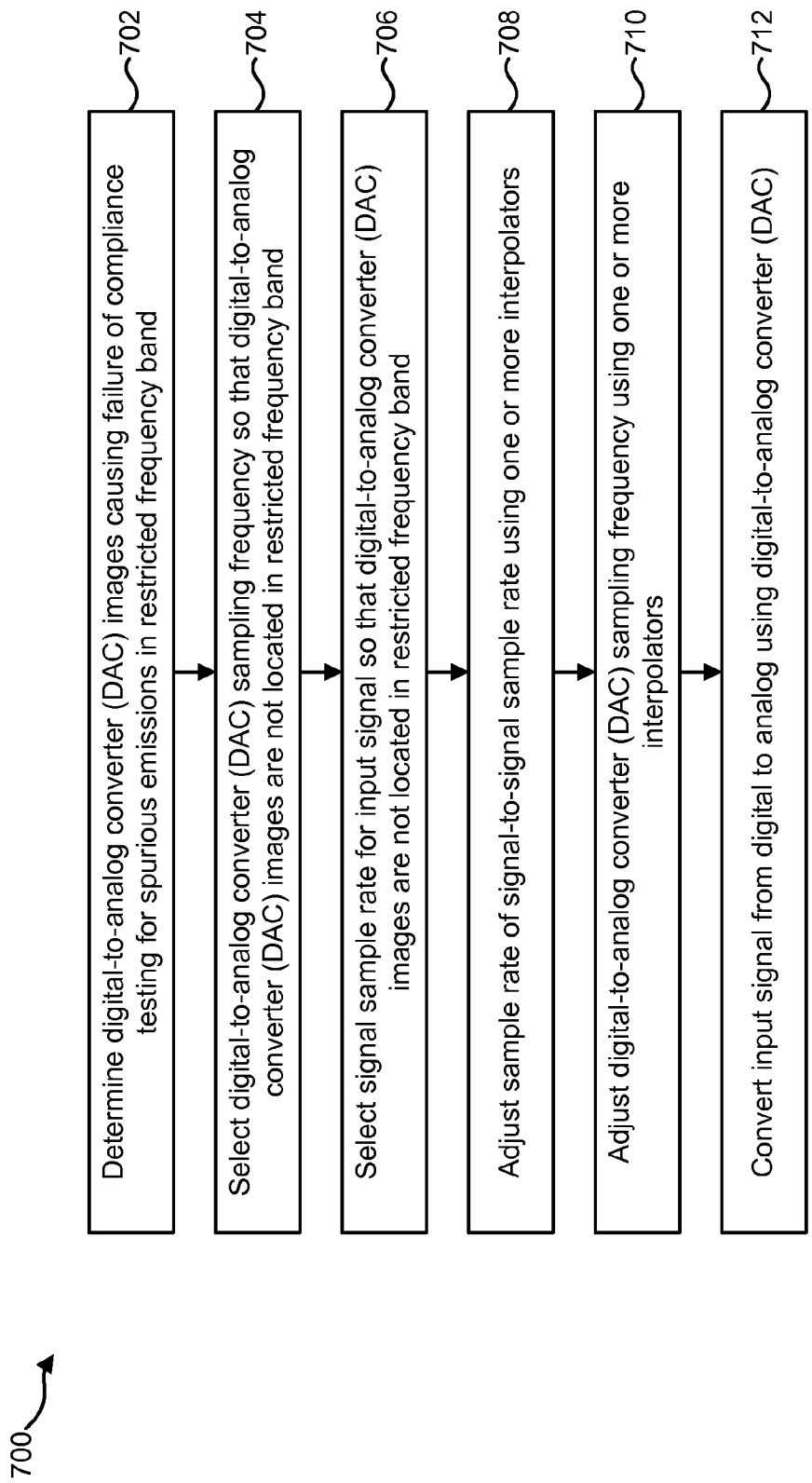
FIG. 7 is a flow diagram of a method for adjusting the digital-to-analog converter (DAC) sampling frequency using interpolators.

FIG. 7 is a flow diagram of a method 700 for adjusting the digital-to-analog converter (DAC) sampling frequency 318 using interpolators 574, 674. The method 700 may be performed by a wireless device 102*a*. The wireless device 102*a* may determine 702 digital-to-analog converter (DAC) images causing a failure of compliance testing for spurious emissions. The term "spurious emissions" may refer to any radio frequency not deliberately created or transmitted. Spurious emissions are often generated by a device that does not create other frequencies. A harmonic or other signal outside a transmitter's assigned channel is typically considered a spurious emission. The DAC images falling within a restricted frequency band may be spurious emissions. Depending on the strength of the digital-to-analog converter (DAC) emissions, the wireless device 102*a* may fail compliance testing requirements.

There are various spurious emissions requirements that a wireless device 102*a* may have to comply with. For example, a government agency may specify that for transmissions in a particular frequency band, any output in an adjacent frequency band (such as a restricted frequency band) has to fall below a certain threshold.

The wireless device 102*a* may select 704 a digital-to-analog converter (DAC) sampling frequency 318 so that the DAC images are not located in a restricted frequency band. The wireless device 102*a* may also select 706 a signal sample rate 334 for an input signal 308 so that the DAC images are not located in a restricted frequency band. In one configuration, the signal sample rate 334 and the digital-to-analog converter (DAC) sampling frequency 318 may be the same.

The wireless device may adjust 708 the sample rate of the input signal 308 to the signal sample rate 334 using one or more interpolators 574, 674. The wireless device 102*a* may adjust the sample rate of the input signal 308 using a multiplexer 576 as illustrated in FIG. 5 or a re-sampler 682 as illustrated in FIG. 6. The wireless device 102*a* may also adjust 710 the digital-to-analog converter (DAC) sampling frequency 318 using one or more interpolators 574, 674. The wireless device 102*a* may then convert 712 the input signal 308 from a digital signal to an analog signal using the digital-to-analog converter (DAC) 120.

Figure 8:
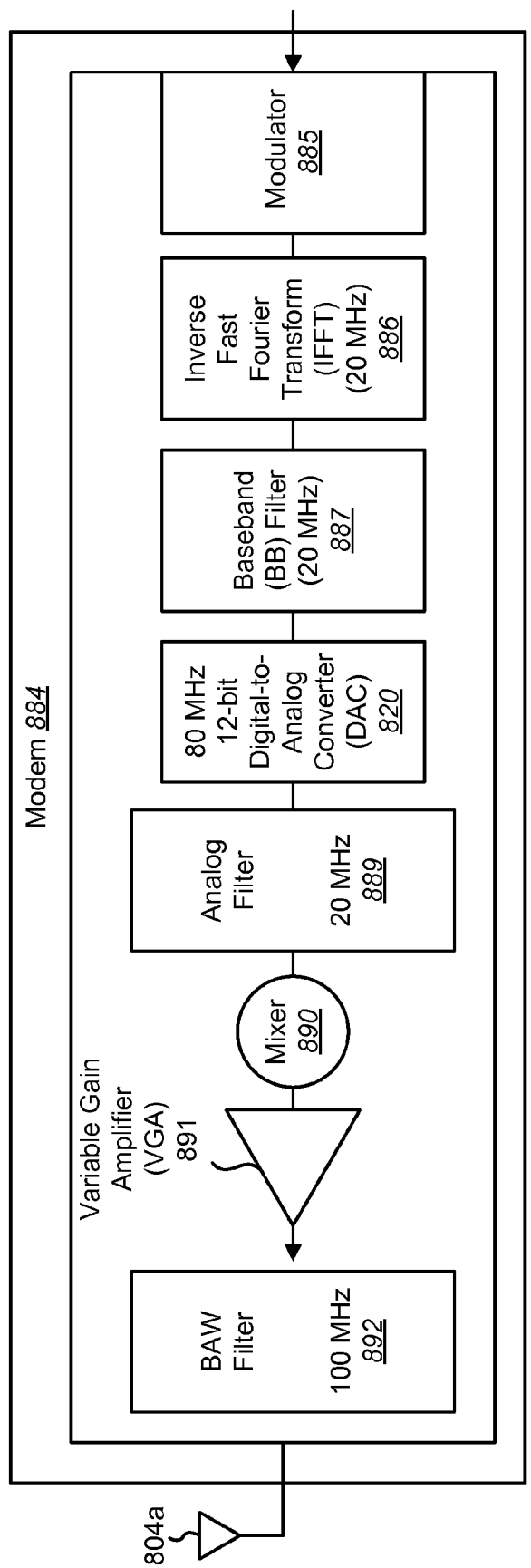
FIG. 8 is a block diagram illustrating a configuration of the front-end architecture for a modem.

FIG. 8 is a block diagram illustrating a configuration of the front-end architecture for a modem 884. The modem 884 may be part of a wireless device 102*a*. A transmission signal stream may be sent through a modulator 885 to prepare the signal stream for conveying a message. An inverse fast Fourier transform (IFFT) 886 may convert the signal stream from the frequency domain to the time domain. A baseband (BB) filter 887 may filter out the undesired high frequency images. A digital-to-analog converter (DAC) 820 may convert the digital signal stream to an analog signal stream and an analog filter 889 may provide additional filtering to the signal stream to further reduce the higher frequency images.

A mixer 890 may convert the analog baseband signal to RF frequencies. A variable gain amplifier (VGA) 891 may maintain a desired output signal level by controlling the gain of the signal stream. Finally, the signal stream may be passed through a Bulk Acoustic Wave (BAW) filter 892 before being transmitted by an antenna 804*a*. The Bulk Acoustic Wave (BAW) filter 892 is an RF passband filter at the center frequency of the transmit channel with a stopband that further suppresses the high frequency images, so that the images are well below the noise floor of the receiver for the receive channel.

Figure 9:
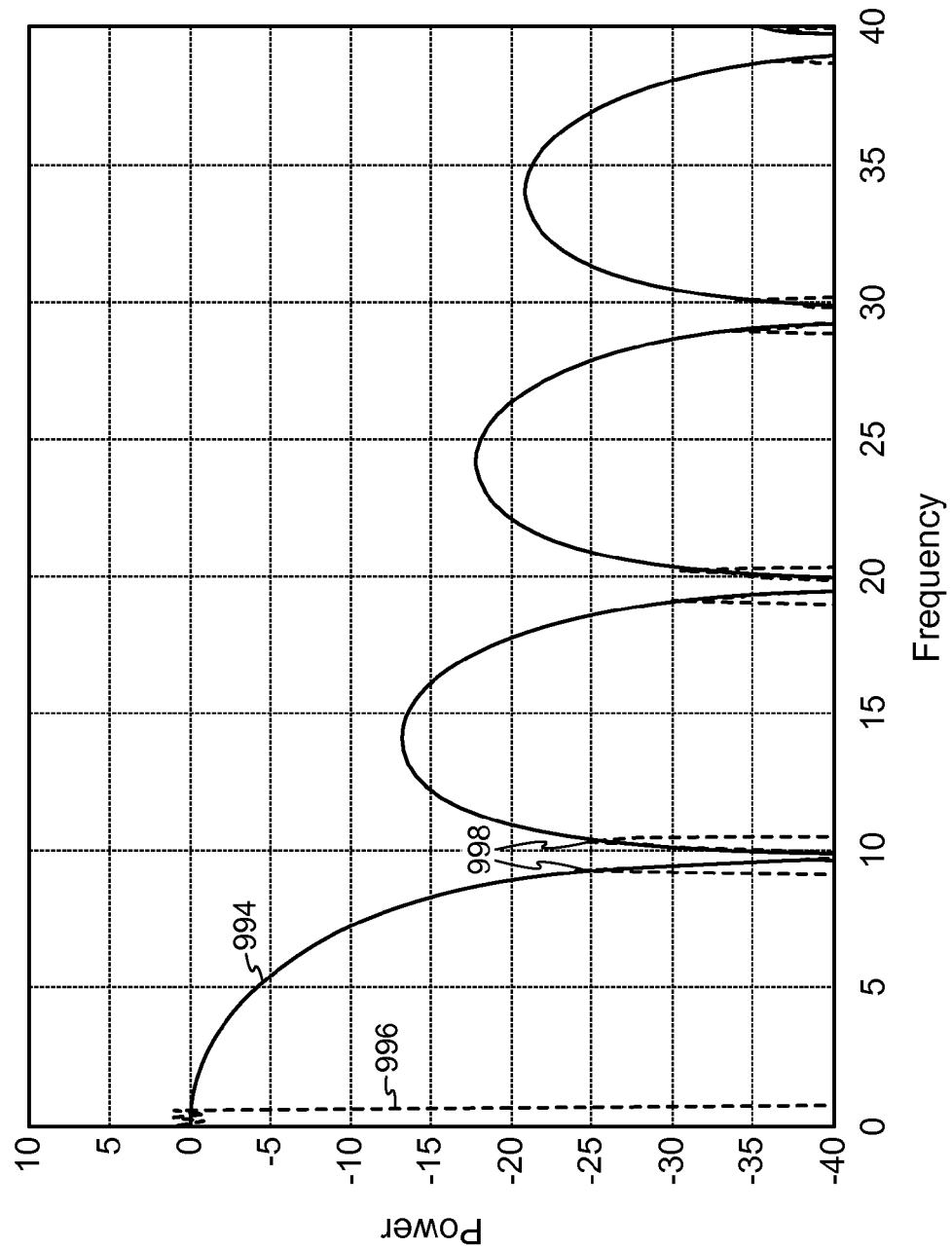
FIG. 9 is a graph illustrating the frequency response of a digital-to-analog converter (DAC) and an output of the digital-to-analog converter (DAC)

FIG. 9 is a graph illustrating the frequency response 994 of a digital-to-analog converter (DAC) 120 and an output 996 of the digital-to-analog converter (DAC) 120. The amplitude of the frequency response 994 may roll off with increasing frequency according to a sinc function $$\left(\text{i.e., } \frac{\sin(\pi x)}{\pi x}\right),$$

leaving "nulls" of very weak image energy around the integer multiples of the sample rate.

The output 996 of the digital-to-analog converter (DAC) 120 may include DAC images 998 around the "nulls" of the frequency response 994. These DAC images 998 interfere with the primary receiver 122 on the wireless device 102a, a secondary receiver 126 on the wireless device 102a or a receiver 130 on another wireless device 102b.

Figure 10:
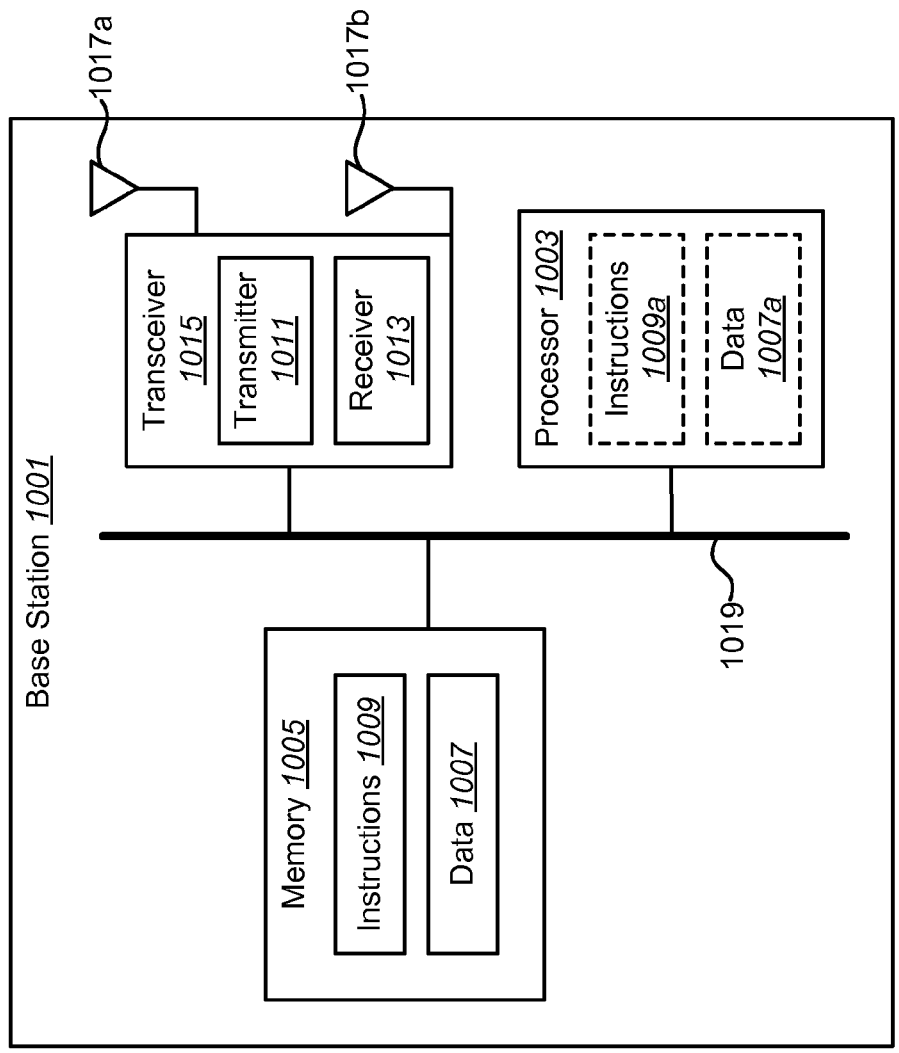
FIG. 10 illustrates certain components that may be included within a base station.

FIG. 10 illustrates certain components that may be included within a base station 1001. The base station 1001 may be an access point, a NodeB, an evolved NodeB, etc. The base station 1001 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the base station 1001 of FIG. 10, in an alternative configuration, a combination of processors (e.g., an ARM and DSP) could be used.

The base station 1001 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007 and instructions 1009 may be stored in the memory 1005. The instructions 1009 may be executable by the processor 1003 to implement the methods disclosed herein. Executing the instructions 1009 may involve the use of the data 1007 that is stored in the memory 1005. When the processor 1003 executes the instructions 1009, various portions of the instructions 1009a may be loaded onto the processor 1003, and various pieces of data 1007a may be loaded onto the processor 1003.

The base station 1001 may also include a transmitter 1011 and a receiver 1013 to allow transmission and reception of signals to and from the wireless device 1001. The transmitter 1011 and receiver 1013 may be collectively referred to as a transceiver 1015. Multiple antennas 1017a-b may be electrically coupled to the transceiver 1015. The base station 1001 may also include (not shown) multiple transmitters, multiple receivers and/or multiple transceivers.

The various components of the base station 1001 may be coupled together by one or more buses, which may include a power bus, a control signal bus, a status signal bus, a data bus, etc. For the sake of clarity, the various buses are illustrated in FIG. 10 as a bus system 1019.

Figure 11:
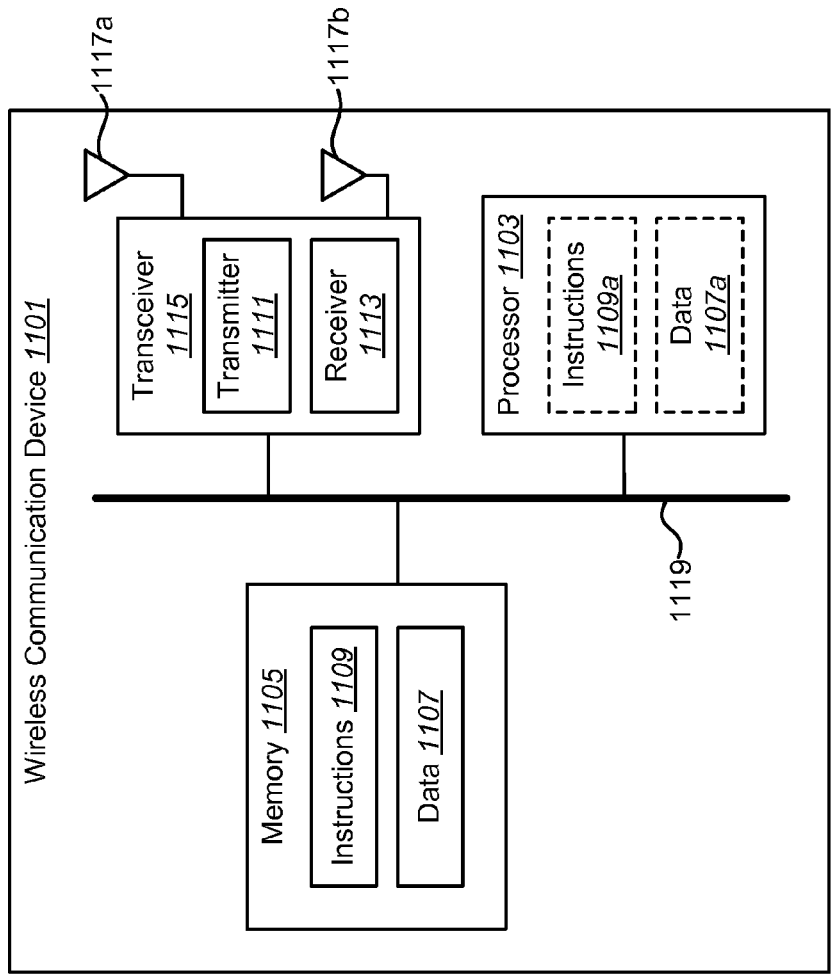
FIG. 11 illustrates certain components that may be included within a wireless communication device.

FIG. 11 illustrates certain components that may be included within a wireless communication device 1101. The wireless communication device 1101 may be an access terminal, a mobile station, a user equipment (UE), etc. The wireless communication device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless communication device 1101 of FIG. 11, in an alternative configuration, a combination of processors (e.g., an ARM and DSP) could be used.

The wireless communication device 1101 also includes memory 1105. The memory 1105 may be any electronic component capable of storing electronic information. The memory 1105 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1109, various portions of the instructions 1109a may be loaded onto the processor 1103, and various pieces of data 1107a may be loaded onto the processor 1103.

The wireless communication device 1101 may also include a transmitter 1111 and a receiver 1113 to allow transmission and reception of signals to and from the wireless communication device 1101. The transmitter 1111 and receiver 1113 may be collectively referred to as a transceiver 1115. Multiple antennas 1117a-b may be electrically coupled to the transceiver 1115. The wireless communication device 1101 may also include (not shown) multiple transmitters, multiple receivers and/or multiple transceivers.

The various components of the wireless communication device 1101 may be coupled together by one or more buses, which may include a power bus, a control signal bus, a status signal bus, a data bus, etc. For the sake of clarity, the various buses are illustrated in FIG. 11 as a bus system 1119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement (s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 2, 4 and 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for interference reduction, the method being implemented in a wireless device, the method comprising:
   selecting a sampling frequency for a digital-to-analog converter (DAC) so that images within a DAC output signal do not interfere with one or more receivers, wherein the DAC has an adjustable sampling frequency so as to be operable at a plurality of sampling frequencies; and
   adjusting a sample rate of an input signal that is provided to the DAC to match the selected sampling frequency for the DAC.

2. The method of claim 1, further comprising:
   determining a frequency or frequencies used by the one or more receivers, wherein the selected sampling frequency for the DAC is selected to avoid interference with the frequency or frequencies used by the one or more receivers; and
   selecting the sample rate of the input signal to avoid interference with the frequency or frequencies used by the one or more receivers.

3. The method of claim 1, further comprising converting the input signal from a digital signal to an analog signal using the DAC with the selected sampling frequency.

4. The method of claim 1, further comprising splitting the input signal into an inphase digital signal and a quadrature digital signal.

5. The method of claim 4, further comprising:
   converting the inphase digital signal to an inphase analog signal using an inphase DAC (I-DAC) with the selected sampling frequency; and
   converting the quadrature digital signal to a quadrature analog signal using a quadrature DAC (Q-DAC) with the selected sampling frequency.

6. The method of claim 1, wherein the wireless device is a multi-mode wireless communication device.

7. The method of claim 1, wherein the one or more receivers comprises a cellular receiver of the wireless device.

8. The method of claim 1, wherein the one or more receivers comprises a Global Positioning System (GPS) receiver of the wireless device.

9. The method of claim 1, wherein the one or more receivers comprises a Bluetooth receiver of the wireless device.

10. The method of claim 1, wherein the one or more receivers comprises a Wireless Local Area Network (WLAN) receiver of the wireless device.

11. The method of claim 1, wherein the one or more receivers comprises a receiver on another wireless device.

12. The method of claim 11, further comprising determining one or more DAC images causing a failure of compliance testing for spurious emissions by the wireless device, wherein the selected sampling frequency is selected so that DAC images are not located in a restricted frequency band.

13. The method of claim 1, wherein a sample rate of the input signal is adjusted using one or more interpolators.

14. The method of claim 13, wherein outputs of the one or more interpolators are input into a multiplexer.

15. The method of claim 13, wherein the one or more interpolators are aligned serially, and wherein a final interpolator output is input into a re-sampler.

16. The method of claim 1, wherein the selected sampling frequency for the DAC is selected based on a band class in which a cellular transmitter of the wireless device is currently operating.

17. A multi-mode modem for a wireless device, comprising:
- a controller that is configured to determine a sampling frequency for a digital-to-analog converter (DAC) so that images within the output signal of the DAC do not interfere with one or more receivers, wherein the DAC has an adjustable sampling frequency so as to be operable at a plurality of sampling frequencies; and
- an interpolator bank that is configured to increase a sample rate of an input signal that is to be provided as an input to the DAC to match the determined sampling frequency for the DAC.

18. The multi-mode modem of claim 17, further comprising a multiplexer, wherein the multiplexer receives the output of each interpolator in the interpolator bank, and wherein the controller is configured to select the output of an interpolator that is provided to the DAC.

19. The multi-mode modem of claim 17, further comprising a re-sampler, wherein the re-sampler receives an input signal with a lower limit sample rate and provides an output signal with a sample rate between the lower limit sample rate and an upper limit sample rate, and wherein the controller is configured to select the sample rate of the output signal.

20. The multi-mode modem of claim 17, wherein the determined sampling frequency for the DAC is determined to avoid interference with a frequency or frequencies used by the one or more receivers.

21. The multi-mode modem of claim 17, wherein the input signal is split into an inphase digital signal and a quadrature digital signal.

22. The multi-mode modem of claim 21, further comprising an inphase DAC (I-DAC) and a quadrature DAC (Q-DAC), wherein the I-DAC converts the inphase digital signal to an analog signal and the Q-DAC converts the quadrature digital signal to an analog signal.

23. The multi-mode modem of claim 17, wherein the one or more receivers comprises a cellular receiver of the wireless device.

24. The multi-mode modem of claim 17, wherein the one or more receivers comprises a Global Positioning System (GPS) receiver of the wireless device.

25. The multi-mode modem of claim 17, wherein the one or more receivers comprises a Bluetooth receiver of the wireless device.

26. The multi-mode modem of claim 17, wherein the one or more receivers comprises a Wireless Local Area Network (WLAN) receiver of the wireless device.

27. The multi-mode modem of claim 17, wherein the one or more receivers comprises a receiver on another wireless device.

28. The multi-mode modem of claim 27, wherein the determined sampling frequency for the DAC is determined so that DAC images are not located in a restricted frequency band.

29. The multi-mode modem of claim 17, further comprising a multiplexer, wherein outputs of the interpolator bank are input into the multiplexer.

30. The multi-mode modem of claim 17, further comprising a re-sampler, wherein the interpolator bank comprises one or more interpolators aligned serially, and wherein a final interpolator output is input into the re-sampler.

31. The multi-mode modem of claim 17, wherein the determined sampling frequency for the DAC is determined based on a band class in which a cellular transmitter of the wireless device is currently operating.

32. An apparatus for interference reduction, comprising:
- means for selecting a sampling frequency for a digital-to-analog converter (DAC) so that images within a DAC output signal do not interfere with one or more receivers, wherein the DAC has an adjustable sampling frequency so as to be operable at a plurality of sampling frequencies; and
- means for adjusting a sample rate of an input signal that is provided to the DAC to match the selected sample frequency for the DAC.

33. A computer-program product comprising a non-transitory computer-readable medium having instructions thereon, the instructions comprising:
- code for selecting a sampling frequency for a digital-to-analog converter (DAC) so that images within a DAC output signal do not interfere with one or more receivers, wherein the DAC has an adjustable sampling frequency so as to be operable at a plurality of sampling frequencies; and
- code for adjusting a sample rate of an input signal that is provided to the DAC to match the selected sample frequency for the DAC.

* * * * *